United States Patent
Tang

(10) Patent No.: US 10,067,518 B2
(45) Date of Patent: Sep. 4, 2018

(54) BAND-GAP REFERENCE CIRCUIT

(71) Applicant: SHANGHAI HUAHONG GRACE SEMICONDUCTOR MANUFACTURING CORPORATION, Shanghai (CN)

(72) Inventor: Chengwei Tang, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 15/366,267

(22) Filed: Dec. 1, 2016

(65) Prior Publication Data

US 2017/0315576 A1    Nov. 2, 2017

(30) Foreign Application Priority Data

Apr. 27, 2016    (CN) .......................... 2016 1 0268920

(51) Int. Cl.
| | |
|---|---|
| *G05F 1/46* | (2006.01) |
| *G05F 1/625* | (2006.01) |
| *H03K 17/60* | (2006.01) |
| *H03K 17/687* | (2006.01) |

(52) U.S. Cl.
CPC .............. *G05F 1/461* (2013.01); *G05F 1/625* (2013.01); *H03K 17/60* (2013.01); *H03K 17/687* (2013.01)

(58) Field of Classification Search
CPC ..... G05F 1/10; G05F 1/12; G05F 1/46; G05F 1/461; G05F 1/625; H03K 17/60; H03K 17/687
USPC .......................... 327/513, 538, 539, 542, 543
See application file for complete search history.

(56) References Cited

U.S. PATENT DOCUMENTS

| | | | | |
|---|---|---|---|---|
| 7,113,025 | B2 * | 9/2006 | Washburn | G05F 3/30 323/313 |
| 9,310,825 | B2 * | 4/2016 | Bohannon | G05F 3/30 |
| 2006/0043957 | A1 * | 3/2006 | Carvalho | G05F 3/30 323/313 |
| 2007/0076483 | A1 * | 4/2007 | Colman | G05F 3/30 365/185.21 |
| 2011/0102049 | A1 * | 5/2011 | Conte | G05F 3/30 327/307 |

(Continued)

FOREIGN PATENT DOCUMENTS

CN    102541146 A    7/2012

*Primary Examiner* — William Hernandez
(74) *Attorney, Agent, or Firm* — MKG, LLC

(57) ABSTRACT

A band-gap reference circuit including: mirror current branch circuits, band-gap paths, and an operational amplifier. Each mirror current branch circuit includes a mirror PMOS transistor and an auxiliary PMOS transistor. A drain of each mirror PMOS transistor is connected with a source of a corresponding auxiliary PMOS transistor, and a drain of said each auxiliary PMOS transistor is connected to a top end of a corresponding band-gap path, each gate of each mirror PMOS transistor is connected with an output port of the operational amplifier. A gate of each auxiliary PMOS transistor is connected to a first bias voltage. A substrate electrode of each mirror and auxiliary transistor is all connected to a source voltage. The output port of the operational amplifier outputs a high level less than the source voltage, the first bias voltage is less than an output voltage signal of the operational amplifier.

8 Claims, 3 Drawing Sheets

(56) References Cited

U.S. PATENT DOCUMENTS

2011/0102058 A1\* 5/2011 Conte ................. G05F 3/30
327/512

\* cited by examiner

BAND-GAP REFERENCE CIRCUIT

CROSS REFERENCE TO RELATED APPLICATION

The present application claims priority to Chinese Patent Application No. 201610268920.0 filed on Apr. 27, 2016, the entirety of which is incorporated by reference herein.

BACKGROUND ART

Generally, applications with 5 v electric source voltage domain must be guaranteed to function properly with an electric source at 5.5 v, due to requirement of + or −10% for the operational voltage. On the other hand, while a minimum deviation of a VD (voltage detector which determines whether the voltage surpasses the high voltage alarming threshold by detecting the voltage) for high voltage alarming is required not to interfere with normal operation at 5.5 v, a high voltage alarming voltage might exceed 6 v. For example, a typical high voltage alarming VD at 6v+/−0.4 v has a minimum voltage 5.6 v which is greater than the normal operational voltage 5.5 v, and a maximum voltage 6.4 v, implicating that a high voltage alarm might be set off at 5.6 v, or 6.4 v, or any other value in the range of 6v+/−0.4 v. As 5v CMOS is concerned, the device can still function for a source voltage of 6.4 v, resulting in substantial substrate current leakage which will seriously impact the accuracy of the band-gap reference source.

SUMMARY OF THE INVENTION

An object of the present invention is to provide a band-gap reference circuit for decreasing the substrate leakage current in the circuit, so as to improve precision for the reference voltage.

To solve the afore-mentioned technical problem, the present invention provides a band-gap reference circuit, comprising: three mirror current branch circuits, three band-gap paths, and an operational amplifier.

The three band-gap paths form a temperature-irrelevant reference voltage by means of superposition of a base-emitter voltage and of a base-emitter voltage difference of a diode-connected bipolar transistor, wherein the base-emitter voltage and the base-emitter voltage difference have opposite temperature coefficients.

A bottom end of said each band-gap path is grounded, a top end of said each band-gap path is connected with a source voltage via one of the mirror current branch circuits, and said each mirror current branch circuit comprises a mirror PMOS transistor and an auxiliary PMOS transistor.

Said each mirror PMOS transistor of said each mirror current branch circuit is a mirror image of each other, and a source of said each mirror PMOS transistor of said each mirror current branch circuit is connected with the source voltage; a drain of said each mirror PMOS transistor of said each mirror current branch circuit is connected with a source of the corresponding auxiliary PMOS transistor, and a drain of said each auxiliary PMOS transistor of said each mirror current branch circuit is connected to the top end of the corresponding band-gap path.

A third band-gap path of the three band-gap path is designated as an output path, the top end of the third band-gap path outputs a reference voltage; the top end of a first band-gap path and the top end of a second band-gap path of the three band-gap paths are respectively connected to an input port of the operational amplifier.

A gate of said each mirror PMOS transistor of said each mirror current branch circuit is connected to an output port of the operational amplifier; each gate of said each auxiliary PMOS transistor of said each mirror current branch circuit is connected together and is connected to a first bias voltage.

A substrate electrode of said each mirror PMOS transistor of said each mirror current branch circuit and a substrate electrode of said each auxiliary PMOS transistor of said each mirror current branch circuit are connected to the source voltage.

The output port of the operational amplifier outputs a high level which is less than the source voltage, the first bias voltage is less than an output voltage signal of the operational amplifier, and during operation of the band-gap reference circuit, the auxiliary PMOS transistor enables a drain voltage of the mirror PMOS transistor to rise high enough that a corresponding gate-drain voltage difference of the mirror PMOS transistor is less than a value enabling a substrate leakage current of the mirror PMOS transistor to rise substantially at a rate in order of nanoamperes per volt, and at the mean time, a corresponding gate-drain voltage difference of the auxiliary PMOS transistor is less than a value enabling a substrate leakage current of the auxiliary PMOS transistor to rise substantially at a rate in order of nanoamperes per volt.

As a further improvement, the operational amplifier has a foldable, differential, common-source, and common-gate main body amplifying circuit structure, wherein a first NMOS transistor and a second NMOS transistor constitute two differential input common-source amplifying transistors, a first PMOS transistor and a second PMOS transistor constitute two common-gate amplifying transistors, a drain of the second PMOS transistor is the output port of the operational amplifier, a source of the first PMOS transistor and a source of the second PMOS transistor are respectively connected to a current source circuit consisting of a PMOS transistor, and a drain of the first PMOS transistor is connected with a load circuit via an auxiliary PMOS transistor; a substrate electrode of the first PMOS transistor and a substrate electrode of the corresponding auxiliary PMOS transistor are both connected to the source voltage; a gate of the auxiliary PMOS transistor corresponding to the first PMOS transistor is connected with the first bias voltage, during operation of the band-gap reference circuit, the auxiliary PMOS transistor corresponding to the first PMOS transistor enables a drain voltage of the first PMOS transistor to rise high enough that a corresponding gate-drain voltage difference of the first PMOS transistor is less than a value enabling a substrate leakage current of the first PMOS transistor to rise substantially at a rate in order of nanoamperes per volt, and at the mean time, a corresponding gate-drain voltage difference of the auxiliary PMOS transistor is less than a value enabling a substrate leakage current of the auxiliary PMOS transistor to rise substantially at a rate in order of nanoamperes per volt.

As a further improvement, the gate-drain voltage difference of the mirror PMOS transistor is less than 3 v, and a gate-drain voltage difference of the corresponding auxiliary PMOS transistor is less than 3 v as well.

As a further improvement, the gate-drain voltage difference of the mirror PMOS transistor and a gate-drain voltage difference of the first PMOS transistor are both less than 3 v, and the gate-drain voltage difference of the corresponding auxiliary PMOS transistor is less than 3 v as well.

As a further improvement, the first band-gap path consists of a first bipolar transistor, the second band-gap path consists of a first resistor and a second bipolar transistor which are connected in series, the third band-gap path consists of a second resistor and a third bipolar transistor which are connected in series, and the first bipolar transistor, the second bipolar transistor, and the third bipolar transistor are all of a bipolar structure with a collector electrode and a base electrode being connected together.

The first bipolar transistor, the second bipolar transistor, and the third bipolar transistor are all of a PNP transistor.

A first end of the first resistor is connected with the second bipolar transistor, and a second end of the first resistor acts as the top end of the second band-gap path.

A first end of the second resistor is connected with the third bipolar transistor, and a second end of the second resistor acts as the top end of the third band-gap path.

As a further improvement, a source of the first NMOS transistor and a source of the second NMOS transistor are both connected to a drain of the third NMOS transistor acting as a current source, a source of the third NMOS transistor is grounded, and a gate of the third NMOS transistor is connected with a second bias voltage;

the first bias voltage is provided by a first bias circuit, the first bias circuit comprises a fourth NMOS transistor, a fifth NMOS transistor, and a sixth NMOS transistor, a drain of the sixth NMOS transistor is connected with the source voltage, a gate of the sixth NMOS transistor is connected to the output port of the operational amplifier; a source of the sixth NMOS transistor is connected with a drain and a gate of the fifth NMOS transistor, a source of the fifth NMOS transistor is connected with a drain of the fourth NMOS transistor, a source and a substrate electrode of the fourth NMOS transistor, a substrate electrode of the fifth NMOS transistor, and a substrate electrode of the sixth NMOS transistor are all grounded; a gate of the fourth NMOS transistor is connected with the second bias voltage, and a drain of the fourth NMOS transistor provides the first bias voltage.

As a further improvement, the load circuit corresponding to the first PMOS transistor comprises a seventh NMOS transistor and an eighth NMOS transistor, the second PMOS transistor corresponds to another load circuit comprising a ninth NMOS transistor, a tenth NMOS transistor, and an eleventh NMOS transistor, a drain of the seventh NMOS transistor, a drain of the auxiliary PMOS transistor corresponding to the first PMOS transistor, a gate of the eighth NMOS transistor, and a gate of the eleventh NMOS transistor are connected together, a gate of the seventh NMOS transistor, a gate of the tenth NMOS transistor, and a gate of the ninth NMOS transistor are all connected with a third bias voltage, a source of the seventh NMOS transistor is connected with a drain of the eighth NMOS transistor, and a source of the eighth NMOS transistor is grounded.

A drain of the ninth NMOS transistor is connected with a drain of the second PMOS transistor, a source and a substrate electrode of the ninth NMOS transistor are connected with a drain of the tenth NMOS transistor, a source of the tenth NMOS transistor is connected with a drain of the eleventh NMOS transistor, and a source of the eleventh NMOS transistor is grounded.

A substrate electrode of the seventh NMOS transistor, a substrate electrode of the eighth NMOS transistor, a substrate electrode of the tenth NMOS transistor, and a substrate electrode of the eleventh NMOS transistor are all grounded.

The present invention arranges an auxiliary PMOS transistor at the bottom of the mirror PMOS transistor of each mirror current branch circuit, the auxiliary PMOS transistor being capable of increasing the drain voltage of the mirror PMOS transistor and thus decreasing the gate-drain voltage difference of the mirror PMOS transistor, and by setting the gate-drain voltage difference of the mirror PMOS transistor to be less than a value enabling the substrate leakage current of the mirror PMOS transistor to rise substantially at a rate in order of nanoamperes per volt, the substrate leakage current of the mirror PMOS transistor is maintained at a relatively low value when the source voltage increases; further, the first voltage of the auxiliary PMOS transistor is set so that the gate-drain voltage difference of the auxiliary PMOS transistor is less than a value enabling the substrate leakage current of the auxiliary PMOS transistor rises substantially at a rate in order of nanoamperes per volt, and therefore the substrate leakage current of the auxiliary PMOS transistor is maintained at a relatively low value when the source voltage increases. In a word, the present invention decreases substrate leakage current in the circuit and improves precision of the reference voltage.

The operational amplifier of the present invention adopts a foldable, differential, common-source, and common-gate main body amplified circuit structure, wherein in-between a drain of the first PMOS transistor and a load circuit is connected an auxiliary PMOS transistor which elevates the drain voltage of the first PMOS transistor and enables the gate-drain voltage difference of the first PMOS transistor and the corresponding auxiliary PMOS transistor to be less than a value enabling the substrate leakage current of the corresponding PMOS transistor rises substantially at a rate in order of nanoamperes per volt, thus substrate leakage current in the circuit can be further decreased and the precision of the reference voltage can be further improved.

BRIEF DESCRIPTION OF THE DRAWINGS

In combination with the drawings and embodiments hereunder provided, the present invention will be expounded in more details.

DETAILED DESCRIPTION

Figure 1:
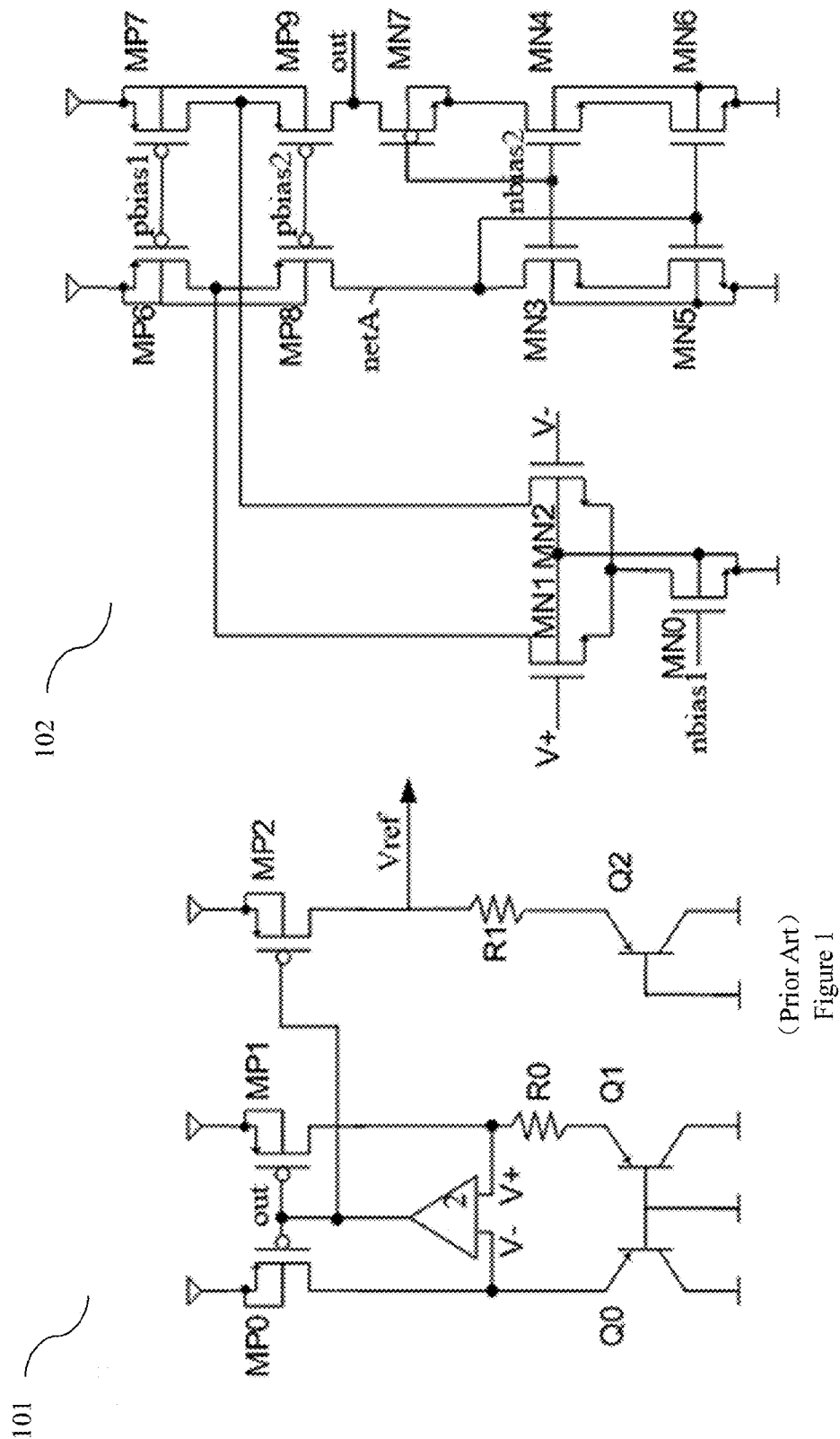
FIG. 1 is a band-gap reference circuit of prior art.

FIG. 1 shows a band-gap reference circuit of prior art; the band-gap reference circuit of prior art comprises a main body circuit 101 and an operational amplifier 102, with the main body circuit 101 comprising three mirror current branch circuits, three band-gap paths, and an operational amplifier;

Each mirror current branch circuit is realized via a PMOS transistor respectively, which is MP0, MP1, and MP2 respectively as shown in FIG. 1. The sources and substrate electrodes of the PMOS transistors MP0, MP1, and MP2 are all connected with the source voltage, the gates of the PMOS transistors MP0, MP1, and MP2 are all connected to the output port of the operational amplifier 102, and the drains of the PMOS transistors MP0, MP1, and MP2 are respectively designated as output ports for the corresponding mirror currents.

The band-gap paths form a temperature-irrelevant reference voltage Vref by means of superposition of a base-emitter voltage and a base-emitter voltage difference of a diode-connected bipolar transistor, wherein the base-emitter voltage and the base-emitter voltage difference have opposite temperature coefficients. As is shown in FIG. 1, the first band-gap path consists of a PNP transistor Q0, the second band-gap path consists of a resistor R0 and a PNP transistor Q1, the third band-gap path consists of a resistor R1 and a PNP transistor Q2, the PNP transistors Q0, Q1, and Q2 are all grounded and have their respective collector electrodes and base electrodes connected together, an emitter of the PNP transistor Q0 is connected with a drain of a PMOS transistor MP0 for outputting a signal V− to a first input port of the operational amplifier 101; a first end of the resistor R0 is connected with an emitter of the PNP transistor Q1, and a second end of the resistor R0 is connected with a drain of a PMOS transistor MP1 for outputting a signal V+ to a second input port of the operational amplifier 101; a first end of the resistor R1 is connected with an emitter of the PNP transistor Q2, and a second end of the resistor R1 is connected with a drain of a PMOS transistor MP2 and outputs the reference voltage Vref.

The operational amplifier 102 has a foldable, differential, common-source, and common-gate main body amplifier circuit structure which consists of NMOS transistors MN1 and MN2, and PMOS transistors MP8 and MP9, wherein the NMOS transistors MN1 and MN2 constitute two differential input common-source amplifying transistors, and the PMOS transistors MP8 and MP9 constitute two common-gate amplifying transistors.

A gate of the NMOS transistor MN1 is connected with the signal V+, a gate of the NMOS transistor MN2 is connected with the signal V−, a source of the NMOS transistor MN1 and a source of the NMOS transistor MN2 are connected with a current source consisting of the NMOS transistor MN0, and a gate of the NMOS transistor MN0 is connected with a bias voltage nbias1.

A source of the PMOS transistor MP8 is connected with a current source consisting of the PMOS transistor MP6, a source of the PMOS transistor MP9 is connected with a current source consisting of the PMOS transistor MP7, a gate of the PMOS transistor MP6 and a gate of the PMOS transistor MP7 are both connected with the bias voltage pbias1, and a gate of the PMOS transistor MP8 and a gate of the PMOS transistor MP9 are both connected with a bias voltage pbias2.

A drain of the PMOS transistor MP8 is connected with a load circuit consisting of series-connected NMOS transistors MN3 and MN5, a drain of the PMOS transistor MP9 is connected with a load circuit consisting of series-connected NMOS transistors MN7, MN4 and MN6. A gate of the NMOS transistor MN7, a gate of the NMOS transistor MN4, and a gate of the NMOS transistor MN3 are all connected with the bias voltage nbias2, a gate of the NMOS transistor MN5, and a gate of the NMOS transistor MN6 are both connected with a drain of the NMOS transistor MN3 and a drain of the PMOS transistor MP8, and the point of connection is a node netA. A drain of the PMOS transistor MP9 is the output port of the operational amplifier 102, and outputs a signal out.

The circuit structure as is shown in FIG. 1 exhibits a substantial substrate leakage current with a comparatively large source voltage, for example at 6.4V, which will adversely impact the precision of the band-gap reference source. In another word, with a normal operational voltage of the band-gap reference source at 5 v plus/minus 10%, source voltage might reach a maximum of 6.4 v without setting off an alarm, that is, the source voltage of the band-gap reference source can reach 6.4 v, whereat the substrate leakage current of the band-gap reference source can be comparatively large so as to impact the precision of the band-gap reference source.

Analysis of the circuit structure as is shown in FIG. 1 reveals that the substrate leakage current of the band-gap reference source mainly comes from the PMOS transistors, such as the PMOS transistors MP0, MP1, MP2, and MP8, the common feature of which is of a comparatively low voltage drain and a comparatively high voltage gate during operation of the band-gap reference source, resulting in a comparatively large gate-drain voltage difference for said PMOS transistors and thus a comparatively large substrate leakage current of the band-gap reference source.

Figure 2A:
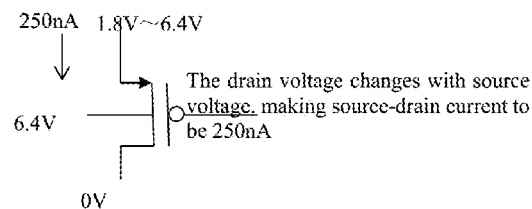
FIG. 2A is a schematic diagram showing testing conditions for substrate leakage current of a PMOS device varying with source voltage.
Figure 2B:
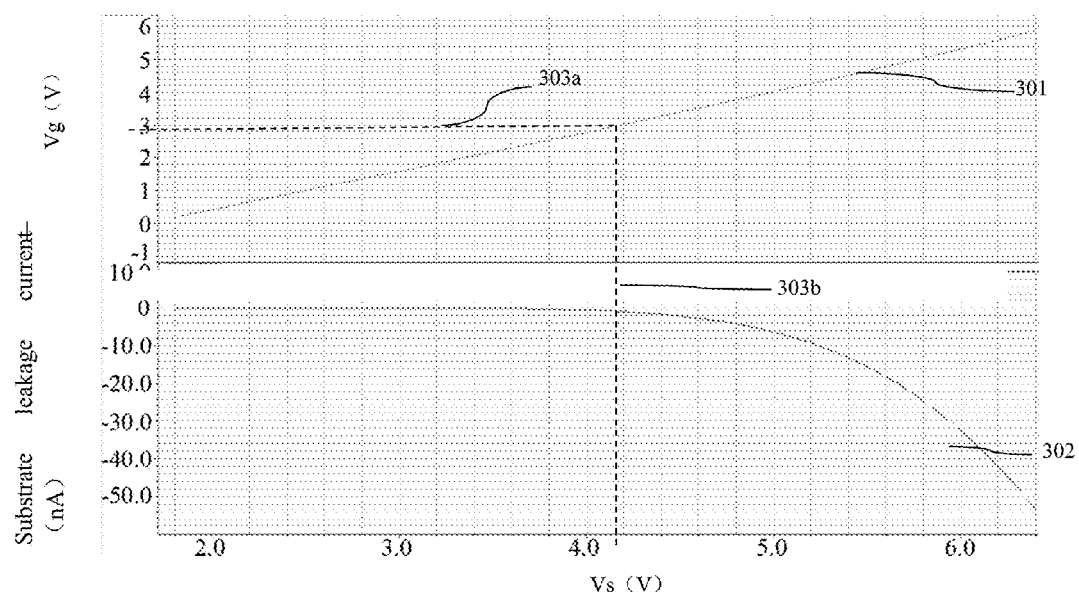
FIG. 2B is a schematic diagram of a testing curve showing substrate leakage current of the PMOS device varying with source voltage.

The cause for the comparatively large substrate leakage current of the above PMOS resistors can be verified with a simulation test, as is shown in FIG. 2A, a schematic diagram showing testing conditions for substrate leakage current of a PMOS device varying with source voltage; while FIG. 2B shows a schematic diagram of a testing curve showing substrate leakage current of the PMOS device varying with source voltage. Simulation shows a drain voltage to be 0 v and a substrate voltage to be 6.4 v under an ideal current at constant source current of 250 nA. Substrate leakage current is simulated by varying source voltage Vs from 1.8 v to 6.4 v with a gate voltage Vg varying with the source voltage Vs in order to keep the source current constant at 250 nA. As are shown in FIG. 2B, curve 301 is a curve of the gate voltage Vg varying with the source voltage Vs; curve 302 is a curve of the substrate leakage current varying with the source voltage Vs; a dotted straight line 303a intersects with the curve 301 at a gate voltage Vg of 3 v, and a dotted straight line 303b intersects with the curve 302 at a position corresponding to a gate-drain voltage difference of 3 v. As can be seen, when the gate-drain voltage difference of the device is larger than 3 v, the substrate leakage current starts to increase substantially and soon reaches a level in order of nA, which will impact the 250 nA source current and the precision of the reference voltage. The substantial increase in the substrate leakage current is due to a large electric field resulting from an excessively big gate-drain voltage difference of the device, leading to a substantially increasing substrate current. Therefore, the gate-drain voltage difference has to be restrained.

Figure 3:
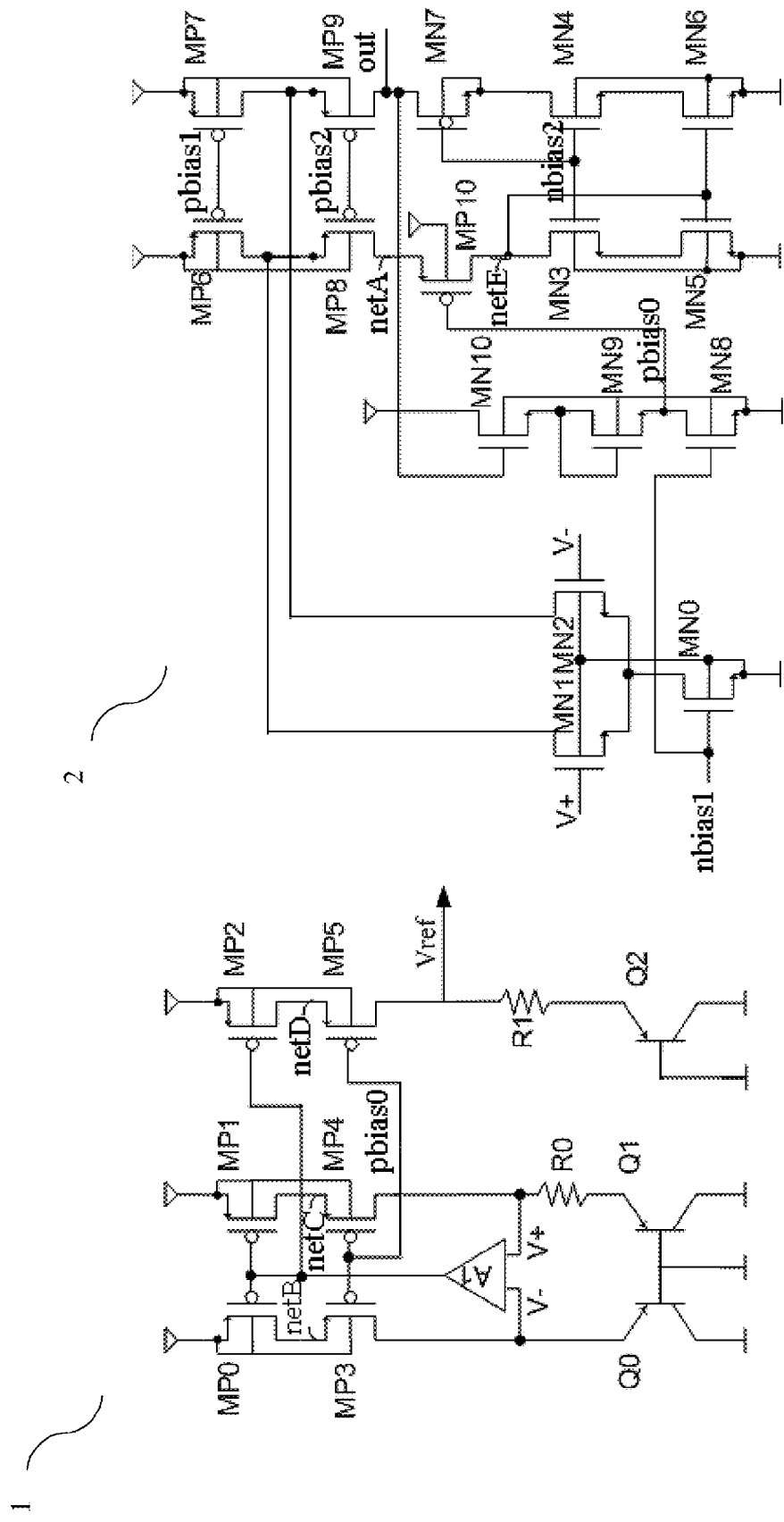
FIG. 3 is a band-gap reference circuit of an embodiment of the present invention.

FIG. 3 shows a band-gap reference circuit of an embodiment of the present invention, comprising: three mirror current branch circuits, three band-gap paths, and an operational amplifier 2; reference sign 1 designates a main body of the band-gap reference circuit, while reference sign 2 designates the operational amplifier.

The three band-gap paths form a temperature-irrelevant reference voltage Vref by means of superposition of a base-emitter voltage and of a base-emitter voltage difference of a diode-connected bipolar transistor, wherein the base-emitter voltage and the base-emitter voltage difference have opposite temperature coefficients.

A bottom end of said each band-gap path is grounded, a top end of said each band-gap path is connected with a source voltage via one of the mirror current branch circuits, and said each mirror current branch circuit comprises respectively a mirror PMOS transistor and an auxiliary PMOS transistor. In an embodiment of the present invention, the mirror PMOS transistors corresponding to their respective mirror current branch circuits are the PMOS transistors MP0, MP1, and MP2, the auxiliary PMOS transistor corresponding to the mirror PMOS transistor MP0 is the auxiliary PMOS transistor MP3, the auxiliary PMOS transistor corresponding to the mirror PMOS transistor MP1 is the auxiliary PMOS transistor MP4, and the auxiliary PMOS transistor corresponding to the mirror PMOS transistor MP2 is the auxiliary PMOS transistor MP5.

Said each mirror PMOS transistor of said each mirror current branch circuit is a mirror image of each other, a gate of the PMOS transistor MP0, a gate of the PMOS transistor MP1, and a gate of the PMOS transistor MP2 are connected together and are connected with an output signal out of the operational amplifier 2; and a source of said each mirror PMOS transistor MP0, MP1, MP2 of said each mirror current branch circuit is connected with the source voltage; a drain of said each mirror PMOS transistor of said each mirror current branch circuit is connected with a source of the corresponding auxiliary PMOS transistor, and a drain of said each auxiliary PMOS transistor of said each mirror current branch circuit is connected to the top end of the corresponding band-gap path.

A third band-gap path of the three band-gap path is designated as an output path, the top end of the third band-gap path outputs a reference voltage Vref; the top end of a first band-gap path and a top end of a second band-gap path of the three band-gap paths are respectively connected to an input port of the operational amplifier 2.

A gate of said each mirror PMOS transistor of said each mirror current branch circuit is connected to an output port of the operational amplifier 2; each gate of said each auxiliary PMOS transistor of said each mirror current branch circuit is connected together and is connected with a first bias voltage pbias0.

A substrate electrode of said each mirror PMOS transistor of said each mirror current branch circuit and a substrate electrode of said each auxiliary PMOS transistor of said each mirror current branch circuit are connected to the source voltage.

The output port of the operational amplifier 2 outputs a high level voltage signal out which is less than the source voltage, the first bias voltage pbias0 is less than the output voltage signal out of the operational amplifier 2, and during operation of the band-gap reference circuit, the auxiliary PMOS transistor enables a drain voltage of the mirror PMOS transistor to rise high enough that a corresponding gate-drain voltage difference of the mirror PMOS transistor is less than a value enabling a substrate leakage current of the mirror PMOS transistor to rise substantially at a rate in order of nanoamperes per volt, and at the mean time, a corresponding gate-drain voltage difference of the auxiliary PMOS transistor is less than a value enabling a substrate leakage current of the auxiliary PMOS transistor to rise at a rate substantially in order of nanoamperes per volt.

In an embodiment of the present invention, the first band-gap path consists of a first bipolar transistor Q0, the second band-gap path consists of a first resistor R0 and a second bipolar transistor Q1 in series connection, the third band-gap path consists of a second resistor R1 and a third bipolar transistor Q2 in series connection, the first bipolar transistor Q0, the second bipolar transistor Q1, and the third bipolar transistor Q2 are all of a bipolar structure with a collector electrode and a base electrode connected together. The first bipolar transistor Q0, the second bipolar transistor Q1, and the third bipolar transistor Q2 are all of a PNP transistor. A first end of the first resistor R0 is connected with the second bipolar transistor Q1, and a second end of the first resistor R0 acts as the top end of the second band-gap path; a first end of the second resistor R1 is connected with the third bipolar transistor Q2, and a second end of the second resistor R1 acts as the top end of the third band-gap path. As can be seen from FIG. 1, a voltage between both ends of the first resistor R0 in the second band-gap path is a voltage difference between a base-emitter voltage of the first bipolar transistor Q0 and of the second bipolar transistor Q1: $\Delta VBE=(V_{beQ0}-V_{beQ1})$; wherein $\Delta VBE$ stands for the difference between the base-emitter voltage of the first bipolar transistor Q0 and of the second bipolar transistor Q1, $V_{beQ0}$ stands for the base-emitter voltage of the first bipolar transistor Q0, and $V_{beQ1}$ stands for the base-emitter voltage of the second bipolar transistor Q1; in the embodiment of the present invention, the emitter area of the second bipolar transistor Q1 is larger than the emitter area of the first bipolar transistor Q0, to make $V_{beQ0}$ bigger than $V_{beQ1}$. Therefore, the current for each of the three mirror current branch circuit is determined by $\Delta VBE/R0$, wherein R0 stands for the resistance of the first resistor R0; finally, the reference voltage Vref is a sum of a base-emitter voltage $V_{beQ2}$ of the third bipolar transistor Q2 with a voltage between the two ends of the second resistor R1, the voltage between the two ends of the second resistor R1 being expressed as $\Delta VBE \times R1/R0$, wherein R1 stands for the resistance of the second resistor R1, and since $V_{beQ2}$ and $\Delta VBE \times R1/R0$ have exactly opposite temperature coefficients, mutual cancellation of the temperature coefficients renders the reference voltage Vref temperature-irrelevant. The three band-gap paths are subject to modifications in other embodiments, for example: the first bipolar transistor Q0, the second bipolar transistor Q1, and the third bipolar transistor Q2 are all of a NPN transistor; or mutual cancellation of temperature coefficients can be realized via other circuit structures.

The operational amplifier 2 adopts a foldable, differential, common-source, and common-gate main body amplifier circuit structure, wherein a first NMOS transistor MN1 and a second NMOS transistor MN2 constitute two differential input common-source amplifying transistors, a first PMOS transistor MP8 and a second PMOS transistor MP9 constitute two common-gate amplifying transistors, a drain of the second PMOS transistor MP9 is the output port of the operational amplifier 2, a source of the first PMOS transistor MP8 and a source of the second PMOS transistor MP9 are respectively connected with a current source circuit consisting of a PMOS transistor. In a preferred embodiment of the present invention, a source of the first PMOS transistor MP8 is connected with a current source circuit consisting of a PMOS transistor MP6, and a source of the second PMOS transistor MP9 is connected with a current source circuit consisting of a PMOS transistor MP7; a source and a substrate electrode of both the PMOS transistors MP6 and MP7 are connected to the source voltage, and a gate of both the PMOS transistors MP6 and MP7 is connected with a bias voltage pbias1.

A drain of the first NMOS transistor MN1 is connected with the source of the first PMOS transistor MP8, a drain of the second NMOS transistor MN2 is connected with the source of the second PMOS transistor MP9; a gate of the first PMOS transistor MP8 and a gate of the second PMOS transistor MP9 are both connected with a bias voltage pbias2.

A drain of the first PMOS transistor MP8 is connected with a load circuit via an auxiliary PMOS transistor MP10; a substrate electrode of the first PMOS transistor MP8 and a substrate electrode of the corresponding auxiliary PMOS transistor MP10 are both connected to the source voltage; a gate of the auxiliary PMOS transistor MP10 corresponding to the first PMOS transistor MP8 is connected with the first bias voltage pbias0, during operation of the band-gap reference circuit, the auxiliary PMOS transistor MP10 corresponding to the first PMOS transistor MP8 enables a drain voltage of the first PMOS transistor MP8 to rise high enough that a corresponding gate-drain voltage difference of the first PMOS transistor MP8 is less than a value enabling a substrate leakage current of the first PMOS transistor MP8 to rise substantially at a rate in order of nanoamperes per volt, and at the mean time, a corresponding gate-drain voltage difference of the auxiliary PMOS transistor MP10 is less than a value enabling a substrate leakage current of the auxiliary PMOS transistor MP10 to rise substantially at a rate in order of nanoamperes per volt.

More optimally, the gate-drain voltage difference of the mirror PMOS transistor and the gate-drain voltage difference of the first PMOS transistor MP8 are both less than 3 v, and a gate-drain voltage difference of the corresponding auxiliary PMOS transistor is also less than 3 v. As can be seen from the simulation shown on FIG. 2B, when a gate-drain voltage difference of a PMOS transistor is less than 3 v, the PMOS transistor can keep a low substrate leakage current value and thus incapable of impacting currents in the various paths.

In a preferred embodiment of the present invention, a source of the first NMOS transistor MN1 and a source of the second NMOS transistor MN2 are both connected to a drain of the third NMOS transistor MN0 acting as a current source, a source of the third NMOS transistor MN0 is grounded, and a gate of the third NMOS transistor MN0 is connected with the second bias voltage nbias1.

The first bias voltage pbia0 is provided by a first bias circuit, the first bias circuit comprises a fourth NMOS transistor MN8, a fifth NMOS transistor MN9, and a sixth NMOS transistor MN10, a drain of the sixth NMOS transistor MN10 is connected with the source voltage, a gate of the sixth NMOS transistor MN10 is connected to the output port of the operational amplifier 2; a source of the sixth NMOS transistor MN10 is connected with a drain and a gate of the fifth NMOS transistor MN9, a source of the fifth NMOS transistor MN9 is connected with a drain of the fourth NMOS transistor MN8, a source and a substrate electrode of the fourth NMOS transistor MN8, a substrate electrode of the fifth NMOS transistor MN9, and a substrate electrode of the sixth NMOS transistor MN10 are all grounded; a gate of the fourth NMOS transistor MN8 is connected with the second bias voltage nbias1, and a drain of the fourth NMOS transistor MN8 provides the first bias voltage pbias0.

The load circuit corresponding to the first PMOS transistor MP8 comprises a seventh NMOS transistor MN3 and an eighth NMOS transistor MN5, the second PMOS transistor MP9 corresponds to another load circuit comprising a ninth NMOS transistor MN7, a tenth NMOS transistor MN4, and an eleventh NMOS transistor MN6, a drain of the seventh NMOS transistor MN3, a drain of the auxiliary PMOS transistor MP10 corresponding to the first PMOS transistor MP8, a gate of the eighth NMOS transistor MN5, and a gate of the eleventh NMOS transistor MN6 are connected together, a gate of the seventh NMOS transistor MN3, a gate of the tenth NMOS transistor MN4, and a gate of the ninth NMOS transistor MN7 are all connected with a third bias voltage, a source of the seventh NMOS transistor MN3 is connected with a drain of the eighth NMOS transistor MN5, and a source of the eighth NMOS transistor MN5 is grounded.

A drain of the ninth NMOS transistor MN7 is connected with a drain of the second PMOS transistor MP9, a source and a substrate electrode of the ninth NMOS transistor MN7 are connected with a drain of the tenth NMOS transistor MN4, a source of the tenth NMOS transistor MN4 is connected with a drain of the eleventh NMOS transistor MN6, and a source of the eleventh NMOS transistor MN6 is grounded. In a preferred embodiment of the present invention, the ninth NMOS transistor MN7 is a native Mosfet with a threshold voltage near 0 v.

A substrate electrode of the seventh NMOS transistor MN3, a substrate electrode of the eighth NMOS transistor MN5, a substrate electrode of the tenth NMOS transistor MN4, and a substrate electrode of the eleventh NMOS transistor MN6 are all grounded.

As is shown on FIG. 3, node netA is the drain of the first PMOS transistor MP8, node netC is the drain of the mirror PMOS transistor MP1, node netD is the drain of the mirror PMOS transistor MP2, and node netE is the drain of the auxiliary PMOS transistor MP10. The present invention, by means of arranging the auxiliary PMOS transistors MP10, MP3, MP4, and MP5, increases the respective voltages at the nodes netA, netB, netC, and netD, so that the gate-drain voltage differences of the corresponding PMOS transistors are reduced, the substrate leakage currents thereof are reduced, and precision of the reference voltage Vref is ultimately increased.

For the prior art circuit as shown in FIG. 1, with a backdrop of 0.13 μm 5V CMOS technology, and with the source voltage at 6.4 v, we have:
as regards the PMOS transistors MP8 and MP9:
Vmp8gate=Vmp9gate=5.065V;
VnetA=750 mV, Imp8sub=10 nA;
Vout=5.36V, Imp9sub=0.
Similarly, for the PMOS transistors MP0, MP1, and MP2:
Vout=Vmp0gate=Vmp1gate=Vmp2gate=5.36V;
V+=650 mV, Imp0sub=105 nA;
V−=650 mV, Imp1sub=105 nA;
Vref=1V, Imp2sub=53 nA.
Wherein Vmp0gate stands for the gate voltage of the PMOS transistor MP0, Vmp1gate stands for the gate voltage of the PMOS transistor MP1, Vmp2gate stands for the gate voltage of the PMOS transistor MP2, Vmp8gate stands for the gate voltage of the PMOS transistor MP8, Vmp9gate stands for the gate voltage of the PMOS transistor MP9, Imp0sub stands for the substrate leakage current of the PMOS transistor MP0, Imp1sub stands for the substrate leakage current of the PMOS transistor MP1, Imp2sub stands for the substrate leakage current of the PMOS transistor MP2, Imp8sub stands for the substrate leakage current of the PMOS transistor MP8, Imp9sub stands for the substrate leakage current of the PMOS transistor MP9; V+ stands for the quantity of the signal V+, V− stands for the quantity of the signal V−, and Vout stands for the quantity of the signal Vout. As can be seen therefrom, the substrate leakage currents of the PMOS transistors MP0, MP1, MP2, and MP8 all reach the order of nA which seriously impact the precision of the band-gap reference circuit.

In contrast to FIG. 1, the circuit embodiment of the present invention as is shown on FIG. 3 adds the NMOS transistors MN8-MN10 and the PMOS transistors MP3, MP4, MP5, and MP10, which will restricted the drain voltages of the PMOS transistors MP8 and MP0-MP2 in a comparatively high voltage, thus decreasing the gate-drain voltage difference. Simulation shows that:
for the PMOS transistor MP8:
Vmp8gate=5.065V;
VnetA=Vout−Vgsmn10−Vgsmn9+Vgsmp10;
Vout=VDD−Vgsmp0;
VnetA=3.695V;
Vmp8gate-drain=1.37V;
Imp8sub=35.44fA.

For the newly adds-on PMOS transistor MP10:
Vmp10gate=2.392V;
VnetE=0.742V;
Vmp10gate-drain=1.65V;
Imp10sub=6.492 pA.

Wherein, Vgsmn10 stands for a gate-source voltage of the NMOS transistor MN10, Vgsmn9 stands for a gate-source voltage of the NMOS transistor MN9, Vgsmp0 stands for a gate-source voltage of the PMOS transistor MP0; Vmp10gate stands for a gate voltage of the PMOS transistor MP10; VDD stands for the source voltage, Vnet A stands for a voltage at node netA, Vnet E stands for a voltage at node netE; Vmp8gate-drain stands the gate-drain voltage difference of the PMOS transistor MP8, Vmp10gate-drain stands for the gate-drain voltage difference of the PMOS transistor MP10; Imp10sub stands for the substrate leakage current of the PMOS transistor MP10. As can be seen, Imp8sub and Imp10sub are respectively in the orders of fA and pA, fare less than the order of nA.

Similarly, the newly adds-on PMOS transistors MP3, MP4, and MP5 prevent the PMOS transistors MP0, MP1, and MP2 from having too low a drain voltage and enable the PMOS transistors MP0, MP1, and MP2 to have a gate-drain voltage difference of less than 3 v, and guarantee the adds-on PMOS transistors MP3, MP4, and MP5 to have a gate-drain voltage difference of less than 3 v, so that the substrate leakage current of the PMOS transistors MP0-MP5 remains at an order of pA, and will not impact the precision of the band-gap reference circuit.

The present invention has thus been enunciated in full details with specific embodiments, but is not meant to be limited thereby. A person of the art, without departure from the principle of the present invention, shall be able to make various modifications thereto, which shall fall within the scope of protection of the present invention.

What is claimed is:

1. A band-gap reference circuit, comprising: three mirror current branch circuits, three band-gap paths, and an operational amplifier;
the three band-gap paths form a temperature-irrelevant reference voltage by means of superposition of a base-emitter voltage and of a base-emitter voltage difference of a diode-connected bipolar transistor, wherein the base-emitter voltage and the base-emitter voltage difference have opposite temperature coefficients;
a bottom end of said each band-gap path is grounded, a top end of said each band-gap path is connected with a source voltage via one of the mirror current branch circuits, and said each mirror current branch circuit comprises a mirror PMOS transistor and an auxiliary PMOS transistor;
said each mirror PMOS transistor of said each mirror current branch circuit is a mirror image of each other, and a source of said each mirror PMOS transistor of said each mirror current branch circuit is connected with the source voltage; a drain of said each mirror PMOS transistor of said each mirror current branch circuit is connected with a source of the corresponding auxiliary PMOS transistor, and a drain of said each auxiliary PMOS transistor is connected to the top end of the corresponding band-gap path;
a third band-gap path of the three band-gap paths is designated as an output path, the top end of the third band-gap path outputs a reference voltage; the top end of a first band-gap path and the top end of a second band-gap path of the three band-gap paths are respectively connected to an input port of the operational amplifier;
a gate of said each mirror PMOS transistor of said each mirror current branch circuit is connected to an output port of the operational amplifier; each gate of said each auxiliary PMOS transistor of said each mirror current branch circuit is connected together and is connected with a first bias voltage;
a substrate electrode of said each mirror PMOS transistor of said each mirror current branch circuit and a substrate electrode of said each auxiliary PMOS transistor of said each mirror current branch circuit are connected to the source voltage;
the output port of the operational amplifier outputs a high level which is less than the source voltage, the first bias voltage is less than an output voltage of the operational amplifier, and during operation of the band-gap reference circuit, the auxiliary PMOS transistor enables a drain voltage of the mirror PMOS transistor to rise high enough so that a gate-drain voltage difference of the mirror PMOS transistor is less than a value enabling a substrate leakage current of the mirror PMOS transistor to rise at a rate substantially in order of nanoamperes per volt, and at the meantime, a corresponding gate-drain voltage difference of the auxiliary PMOS transistor is less than a value enabling a substrate leakage current of the auxiliary PMOS transistor to rise substantially at a rate in order of nanoamperes per volt.

2. The band-gap reference circuit of claim 1, wherein the operational amplifier has a foldable, differential, common-source and common-gate main body amplifying circuit, wherein a first NMOS transistor and a second NMOS transistor constitute two differential input common-source amplifying transistors, a first PMOS transistor and a second PMOS transistor constitute two common-gate amplifying transistors, a drain of the second PMOS transistor is the output port of the operational amplifier, a source of the first PMOS transistor and a source of the second PMOS transistor are respectively connected with a current source circuit consisting of a PMOS transistor, and a drain of the first PMOS transistor is connected with a load circuit by a second auxiliary PMOS transistor; a substrate electrode of the first PMOS transistor and a substrate electrode of the corresponding auxiliary PMOS transistor are both connected to the source voltage; a gate of the auxiliary PMOS transistor corresponding to the first PMOS transistor is connected with the first bias voltage, during operation of the band-gap reference circuit, the auxiliary PMOS transistor enables a drain voltage of the mirror PMOS transistor to rise high enough that a corresponding gate-drain voltage difference of the mirror PMOS transistor is less than a value enabling a substrate leakage current of the mirror PMOS transistor to rise substantially at a rate in order of nanoamperes per volt, and at the meantime, a corresponding gate-drain voltage difference of the auxiliary PMOS transistor is less than a value enabling a substrate leakage current of the auxiliary PMOS transistor to rise substantially at a rate in order of nanoamperes per volt.

3. The band-gap reference circuit of claim 2, wherein, the gate-drain voltage difference of the mirror PMOS transistor and a gate-drain voltage difference of the first PMOS transistor are both less than 3v, and the gate-drain voltage difference of the auxiliary PMOS transistor is also less than 3v.

4. The band-gap reference circuit of claim 2, wherein, a source of the first NMOS transistor and a source of the second NMOS transistor are both connected to a drain of a third NMOS transistor acting as a current source, a source of the third NMOS transistor is grounded, and a gate of the third NMOS transistor is connected with a second bias voltage;

the first bias voltage is provided by a first bias circuit, the first bias circuit comprises a fourth NMOS transistor, a fifth NMOS transistor, and a sixth NMOS transistor, a drain of the sixth NMOS transistor is connected with the source voltage, a gate of the sixth NMOS transistor is connected to the output port of the operational amplifier; a source of the sixth NMOS transistor is connected with a drain and a gate of the fifth NMOS transistor, a source of the fifth NMOS transistor is connected with a drain of the fourth NMOS transistor, a source and a substrate electrode of the fourth NMOS transistor, a substrate electrode of the fifth NMOS transistor, and a substrate electrode of the sixth NMOS transistor are all grounded; a gate of the fourth NMOS transistor is connected with the second bias voltage, and a drain of the fourth NMOS transistor provides the first bias voltage.

5. The band-gap reference circuit of claim 2, wherein, the load circuit corresponding to the first PMOS transistor comprises a seventh NMOS transistor and an eighth NMOS transistor, the second PMOS transistor corresponds to another load circuit comprising a ninth NMOS transistor, a tenth NMOS transistor, and an eleventh NMOS transistor, a drain of the seventh NMOS transistor; a drain of the auxiliary PMOS transistor corresponding to the first PMOS transistor, a gate of the eighth NMOS transistor, and a gate of the eleventh NMOS transistor are connected together; a gate of the seventh NMOS transistor, a gate of the tenth NMOS transistor, and a gate of the ninth NMOS transistor are all connected with a third bias voltage; a source of the seventh NMOS transistor is connected with a drain of the eighth NMOS transistor, and a source of the eighth NMOS transistor is grounded;

a drain of the ninth NMOS transistor is connected with a drain of the second PMOS transistor, a source and a substrate electrode of the ninth NMOS transistor are connected with a drain of the tenth NMOS transistor; a source of the tenth NMOS transistor is connected with a drain of the eleventh NMOS transistor, and a source of the eleventh NMOS transistor is grounded;

a substrate electrode of the seventh NMOS transistor, a substrate electrode of the eighth NMOS transistor, a substrate electrode of the tenth NMOS transistor, and a substrate electrode of the eleventh NMOS transistor are all grounded.

6. The band-gap reference circuit of claim 1, wherein the gate-drain voltage difference of the mirror PMOS transistor is less than 3v, and the gate-drain voltage difference of the corresponding auxiliary PMOS transistor is also less than 3v.

7. The band-gap reference circuit of claim 1, wherein,
the first band-gap path consists of a first bipolar transistor, the second band-gap path consists of a first resistor and a second bipolar transistor which are series connected, the third band-gap path consists of a second resistor and a third bipolar transistor which are series connected, and the first bipolar transistor, the second bipolar transistor, and the third bipolar transistor are all of a diode structure with a collector electrode and a base electrode connected together;

the first bipolar transistor, the second bipolar transistor, and the third bipolar transistor are all of a PNP transistor;

a first end of the first resistor is connected with the second bipolar transistor, and a second end of the first resistor acts as the top end of the second band-gap path;

a first end of the second resistor is connected with the third bipolar transistor, and a second end of the second resistor acts as the top end of the third band-gap path.

8. The band-gap reference circuit of claim 2, wherein,
the first band-gap path consists of a first bipolar transistor, the second band-gap path consists of a first resistor and a second bipolar transistor which are series connected, the third band-gap path consists of a second resistor and a third bipolar transistor which are series connected, and the first bipolar transistor, the second bipolar transistor, and the third bipolar transistor are all of a diode structure with a collector electrode and a base electrode connected together;

the first bipolar transistor, the second bipolar transistor, and the third bipolar transistor are all of a PNP transistor; or, the first bipolar transistor, the second bipolar transistor, and the third bipolar transistor are all of an NPN transistor;

a first end of the first resistor is connected with the second bipolar transistor, and a second end of the first resistor acts as the top end of the second band-gap path;

a first end of the second resistor is connected with the third bipolar transistor, and a second end of the second resistor acts as the top end of the third band-gap path.

* * * * *